United States Patent [19]

Suda et al.

[11] Patent Number: 5,140,177
[45] Date of Patent: Aug. 18, 1992

[54] COMPLEMENTARY CIRCUIT DEVICE RETURNABLE TO NORMAL OPERATION FROM LATCH-UP PHENOMENON

[75] Inventors: Shinji Suda; Hiroshi Kobayashi; Katsunobu Hongo; Hiroyuki Nakao, all of Hyogo, Japan

[73] Assignee: Mitsubishi Denki Kabushiki Kaisha, Tokyo, Japan

[21] Appl. No.: 442,754

[22] Filed: Nov. 29, 1989

[30] Foreign Application Priority Data

Dec. 2, 1988 [JP] Japan .................. 63-306633
Dec. 24, 1988 [JP] Japan .................. 63-327067
Sep. 21, 1989 [JP] Japan .................. 1-247473

[51] Int. Cl.⁵ .................... H03K 3/284; H03K 17/16
[52] U.S. Cl. .................... 307/272.3; 307/443; 307/451; 307/296.5
[58] Field of Search .......... 307/272.3, 592, 443, 307/451, 296.5, 296.1

[56] References Cited

U.S. PATENT DOCUMENTS

| 4,594,633 | 6/1986 | Townsend et al. | 361/57 |
| 4,786,862 | 11/1988 | Sieron | 371/14 |
| 4,791,316 | 12/1988 | Winnerl et al. | 307/272.3 |
| 4,820,936 | 4/1989 | Veendrick et al. | 307/592 |
| 4,900,951 | 2/1990 | Saito | 307/480 |

FOREIGN PATENT DOCUMENTS

260593A1 5/1987 German Democratic Rep. .
59-202659 11/1984 Japan .
2120427B 4/1983 United Kingdom .

OTHER PUBLICATIONS

"M6800 Microprocessor Application Manual", by Motorola 1975, pp. 4-43.

Primary Examiner—Edward P. Westin
Assistant Examiner—Richard Roseen
Attorney, Agent, or Firm—Lowe, Price, LeBlanc & Becker

[57] ABSTRACT

A complementary circuit device which cancels a latch-up phenomenon to return to normal operation includes a complementary circuit, a latch-up detection circuit and a reset circuit. The complementary circuit, which is normally started from a prescribed logic state in response to an initial power application of power to the circuit, is susceptible to erroneous restart when the same is resupplied with power immediately after occurrence of a latch-up phenomenon. The latch-up detection circuit detects a latch-up phenomenon occurring in the complementary circuit. The reset circuit resets the complementary circuit to the prescribed logic state in response to an output from the latch-up detection circuit. The complementary circuit is reset again to the prescribed state in a manner similar to the case of initial application of power. The invention facilitates a normal return to operation of a complementary circuit upon cancellation of the latch-up phenomenon.

12 Claims, 9 Drawing Sheets

FIG. 9
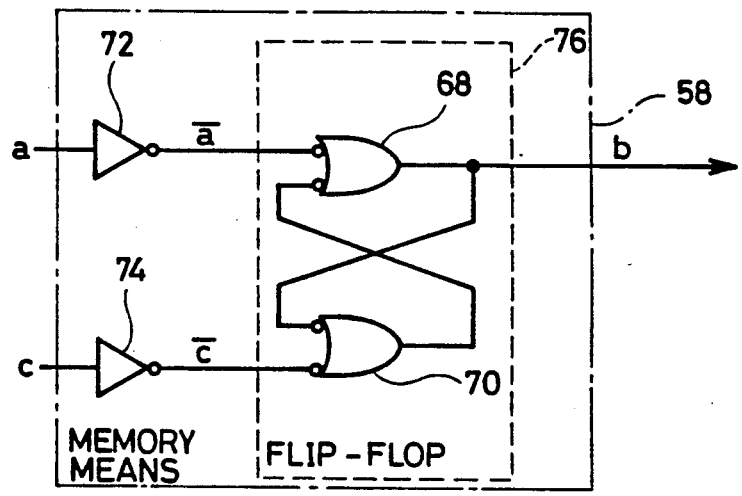
FIG. 10
|     | a   | c   | b   |
|-----|-----|-----|-----|
| (a) | "L" | "L" | "L" |
| (b) | "H" | "L" | "H" |
| (c) | "L" | "L" | "H" |
| (d) | "L" | "H" | "L" |
| (e) | "L" | "L" | "L" |
FIG. 11
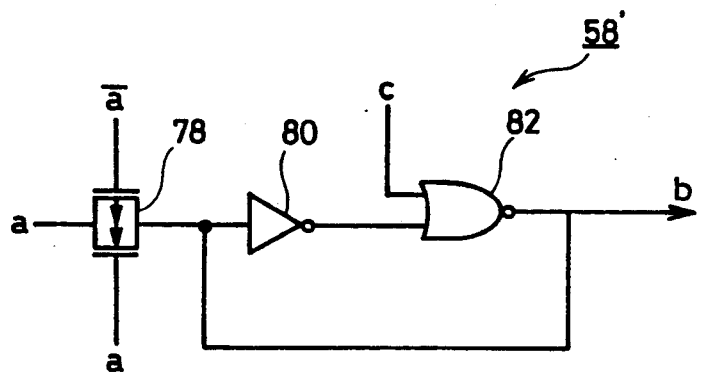

|     | a   | c   | b   |
|-----|-----|-----|-----|
| (a) | "H" | "L" | "L" |
| (b) | "L" | "L" | "H" |
| (c) | "H" | "L" | "H" |
| (d) | "H" | "H" | "L" |
| (e) | "H" | "L" | "L" |

COMPLEMENTARY CIRCUIT DEVICE RETURNABLE TO NORMAL OPERATION FROM LATCH-UP PHENOMENON

BACKGROUND OF THE INVENTION

1. Field of the Invention

The present invention relates to a complementary circuit device, and more particularly, it relates to a CMOS (complementary metal-oxide-semiconductor) integrated circuit which is automatically released from a latch-up phenomenon for returning to an operating state.

2. Description of the Background Art

In general, a latch-up phenomenon may occur in a CMOS integrated circuit due to its structure. The latch-up phenomenon is such a phenomenon that a bipolar transistor (thyristor) formed in relation to the CMOS structure is triggered by some external factor to enter a conducting state during normal logical circuit operation of the CMOS integrated circuit, whereby an excessive source current flows to the CMOS structure. If such a latch-up phenomenon occurs during operation of an integrated circuit (IC), normal logical circuit operation cannot be performed. Besides, the IC may be broken if the latch-up state is prolonged.

In order to restore the IC to a normal operating state upon occurrence of such a latch-up phenomenon, it is necessary to interrupt power supply to the IC.

The principle operation of the latch-up phenomenon is disclosed in a number of documents. With reference to FIGS. 1 and 2, the said principle of operation is now briefly described.

A CMOS semiconductor device shown in FIG. 1 defines a CMOS inverter, an equivalent circuit of which is shown in FIG. 2. Referring to FIG. 1, an N$^-$ well 4 is formed in a P$^-$ semiconductor substrate 2, and a P-channel MOS transistor 6 is formed in the N$^-$ well 4. The P-channel MOS transistor 6 includes P$^+$ source and drain regions 8 and 10 formed on the N$^-$ well 4, a gate insulating film 12 formed in a region between the P$^+$ source and drain regions 8 and 10 on a surface part of the N$^-$ well 4, and a gate electrode 14 formed on the gate insulating film 12.

An N-channel MOS transistor 16 is formed on a part of the P$^-$ semiconductor substrate 2 other than that provided with the N$^-$ well 4. The N-channel MOS transistor 16 includes N$^+$ source and drain regions 18 and 20 formed on the P$^-$ semiconductor substrate 2, a gate insulating film 22 formed in a region between the N$^+$ source and drain regions 18 and 20 on a surface part of the P$^-$ semiconductor substrate 2, and a gate electrode 24 formed on the gate insulating film 22. The gate electrodes 14 and 24 are connected to an input terminal. The P$^+$ source region 8 and the N$^+$ drain region 20 are connected to an output terminal 26. A power terminal 28 applies source voltage $V_{CC}$ to the P$^+$ drain region 10, and a ground terminal 30 applies ground voltage $V_{SS}$ to the N$^+$ source region 18.

In this example, an N$^+$P$^-$N$^-$ transistor Tr1 is transversely defined as a parasitic transistor by the N$^+$ source region 18 serving as an emitter, the P$^-$ semiconductor substrate 2 serving as a base and the N$^-$ well 4 serving as a collector. Further, a P$^+$N$^-$P$^-$ transistor Tr2 is vertically defined by the P$^+$ drain region 10 serving as an emitter, the N$^-$ well 4 serving as a base and the P$^-$ semiconductor substrate 2 serving as a collector.

Referring to FIG. 3, parasitic resistance Ra1 is formed between the N$^-$ well 4 and the power terminal 28. Parasitic resistance Ra0 is formed between the P$^+$ drain region 10 and the power terminal 28. Parasitic resistance Rb0 is formed between the N$^+$ source region 18 and the ground terminal 30. Parasitic resistance Rb1 is formed between the P$^-$ semiconductor substrate 2 and the ground terminal 30.

It is assumed that the CMOS semiconductor device shown in FIG. 1 is in an operating state. Description is now made on operation performed when the power terminal 28 receives positive noise. Referring to FIGS. 1 to 3, it is assumed that relations Ra0<Ra1 and Rb0<Rb1 hold. In this case, there is such possibility that the potential of the P$^+$ drain region 10 serving as the emitter of the transistor Tr2 is higher than that of the N$^-$ well 4 serving as the base of the transistor Tr2, due to the aforementioned noise. If conditions are satisfied, injection is caused from the emitter of the transistor Tr2, i.e., the P$^+$ drain region 10, into the base, i.e., the N$^-$ well 4. The transistor Tr2 enters an on state. In this case, the current flowing from the emitter, i.e., the P$^+$ drain region 10 into the transistor Tr2 is amplified by the transistor Tr2 due to the characteristics of the bipolar transistor, to flow into the collector, i.e., the P$^-$ semiconductor substrate 2. This current is referred to as Ia.

Between the base of the transistor Tr1, i.e., the P$^-$ semiconductor substrate 2, the ground terminal 30 and the emitter, i.e., the N$^+$ source region 18, potential difference is developed by the parasitic resistance Rb1. Since the relation Rb0<Rb1 holds, injection is caused from the base of the transistor Tr1, i.e., the P$^-$ semiconductor substrate 2 into the emitter, i.e., the N$^+$ source region 18. Consequently, the transistor Tr1 is turned on. Then, a current Ib flows from the collector of the transistor Tr1, i.e., the N$^-$ well 4 to the emitter, i.e., the N$^+$ source region 18. The transistors Tr1 and Tr2 remain in on states so far as the current flows.

In this case, the aforementioned circuit forms a thyristor as shown in FIG. 4. In this thyristor, currents flow from the power terminal 28 to the ground terminal 30 if an appropriate current is supplied to a gate 32 when the power terminal 28 is at a plus potential with respect to the ground terminal 30. It is known that these currents continuously flow unless the potential of the power terminal 28 is made identical to that of the ground terminal 30. In other words, the currents Ia and Ib shown in FIG. 3 continuously flow unless the power is interrupted.

This phenomenon is called a latch-up phenomenon. In a CMOS integrated circuit, such a latch-up phenomenon may occur due to its structure.

Various countermeasures have been generally proposed in order to prevent the latch-up phenomenon. FIG. 5 shows an example of such a countermeasure. The circuit shown in FIG. 3 will not define a thyristor unless conditions Ra0<Ra1 and Rb0<Rb1 hold for Ra0, Ra1, Rb0 and Rb1. In the example shown in FIG. 5, bases and emitters of parasitic transistors Tr1 and Tr2 are made to have the same potentials, so that the aforementioned conditions will not hold.

Referring to FIG. 5, an N$^-$ well 4 is formed in a P$^-$ semiconductor substrate 2, and a P-channel MOS transistor 6 is formed in the N$^-$ well 4. The P-channel MOS transistor 6 includes P$^+$ source and drain regions 8 and 10 formed on the N⁻ well 4; a gate insulating film 12 formed in a region between the P source and drain regions 8 and 10 on a surface part of the N⁻ well 4, and a gate electrode 14 formed on the gate insulating film 12.

An N-channel MOS transistor 16 is formed on a part of the P⁻ semiconductor substrate 2 other than that provided with the N⁻ well 4. The N-channel MOS transistor 16 includes N+ source and drain regions 18 and 20 formed on the P⁻ semiconductor substrate 2, a gate insulating film 22 formed in a region between the N+ source and drain regions 18 and 20 on a surface part of the P⁻ semiconductor substrate 2, and a gate electrode 24 formed on the gate insulating film 22.

The gate electrodes 14 and 24 are connected to an input terminal. The P+ source region 18 and the N+ drain region 20 are connected to an output terminal 26. A power terminal 28 applies source voltage $V_{CC}$ to the P+ drain region 10. A ground terminal 30 applies ground voltage $V_{SS}$ to the N+ source region 18. The above structure is similar to that of the CMOS semiconductor device shown in FIG. 1.

The CMOS semiconductor device shown in FIG. 5 further includes a P+ diffusion region 34 which is formed on a surface part of the P⁻ semiconductor substrate 2 held between the N+ drain region 20 and the N⁻ well 4 in a spaced-apart manner, and an N+ diffusion region 36 formed on a surface part of the semiconductor substrate 2 held between the P+ diffusion region 34 and the N⁻ well 4, to be spaced apart from the P+ diffusion region 34 and adjacent to the N⁻ well 4. The P+ diffusion region 34 is connected to the ground terminal 30. The N+ diffusion region 36 is connected to the power terminal 28.

The P+ diffusion region 34 connects the ground terminal 30 to the P⁻ semiconductor substrate 2. The N+ diffusion region 36 connects the power terminal 28 to the N⁻ well 4. Consequently, the parasitic resistance Rb1 as well as the parasitic resistance Ra1, which are shown in FIG. 3, are extremely reduced. Thus, the aforementioned conditions for the latch-up phenomenon are hardly satisfied. Namely, it is substantially impossible to simultaneously satisfy both conditions Ra0<Ra1 and Rb0<Rb1.

However, the circuit pattern of the latch-up preventing circuit shown in FIG. 5 is so complicated that the transverse area of the integrated circuit is increased. Particularly since refinement of an integrated circuit is strongly required nowadays, it is not preferable to hinder such refinement in order to prevent the latch-up phenomenon.

To this end, demanded is a technique which can prompt refinement of a CMOS integrated circuit, while protecting the same against bad influence exerted by the latch-up phenomenon. FIG. 6 shows an exemplary technique developed for such an object. This complementary circuit device is disclosed in Japanese Patent Laying-Open No. 59-202659. The invention relating to the complementary circuit device shown in FIG. 6 is not directly aimed at preventing a latch-up phenomenon caused in a CMOS integrated circuit, but the object thereof is to automatically cancel a latch-up phenomenon occurring in a CMOS integrated circuit and restore the same to an operating state.

Referring to FIG. 6, the conventional complementary circuit device includes a CMOS integrated circuit 42 which is connected between a first power source 38 and a second power source 40, latch-up detection means 44 which is connected between the first power source 38 and the CMOS integrated circuit 42 for detecting a latch-up phenomenon occurring in the CMOS integrated circuit 42, and switching means 46 which is connected between the second power source 40 and the CMOS integrated circuit 42 for cutting an energization path to the CMOS integrated circuit 42 on the basis of an output from the latch-up detection means 44. The latch-up detection means 44 is formed by means for detecting a current flowing in the CMOS integrated circuit 42, for example.

With reference to FIG. 6, the operation of this complementary circuit device is now described. When the CMOS integrated circuit 42 normally operates, the switching means 46 is closed. A weak current flows from the second power source 40 to the first power source 38. In response to this weak current, the latch-up detection means 44 sends a signal indicating the normal operating state to the switching means 46. The switching means 46 is in a conducting state while the same receives the signal indicating the normal operating state. In other words, a prescribed current is supplied to the CMOS integrated circuit 42 when the same is in the normal operating state.

When a latch-up phenomenon occurs in the CMOS integrated circuit 42 due to some cause, the current passing through the CMOS integrated circuit 42 is increased. The latch-up detection means 44 detects the increase in the current passing through the CMOS integrated circuit 42, for example, and sends a signal indicating the current abnormality to the switching means 46. The switching means 46 cuts the energization path in response to the signal indicating the current abnormality. Thus, the CMOS integrated circuit 42 is released from the latch-up phenomenon since the current is interrupted.

When the latch-up phenomenon is thus cancelled, the current flowing in the energization path is by far reduced as compared with that in the latch-up phenomenon. In response to such reduction of the current, the latch-up detection means 44 stops transmission of the signal indicating the current abnormality. Consequently, the switching means 46 re-enters the conducting state. A current is supplied to the CMOS integrated circuit 42, which in turn re-starts its operation. Thus, the complementary circuit device shown in FIG. 6 can detect occurrence of a latch-up phenomenon and automatically cancel the same, to return to its operating state. According to this method, it is possible to effectively cope with a latch-up phenomenon without hindering refinement of the CMOS integrated circuit.

However, the conventional complementary circuit device has the following problems: One of the problems is that the types of CMOS integrated circuits applicable to the circuit shown in FIG. 6 are restricted. For example, types of logical circuits which are assembled into integrated circuits are classified into that whose output is determined by only combination of inputs at a certain point of time and that whose output is determined by combination of not only inputs at a certain point of time but states in advance thereof. The former is called a combinational logical circuit, and the latter is called a sequential logical circuit.

Suppose that the aforementioned CMOS integrated circuit includes only a combinational logical circuit. In this case, the output of the CMOS integrated circuit is automatically set by combination of external inputs at a certain point of time, so far as the CMOS integrated circuit is in an operable state. Therefore, the CMOS integrated circuit correctly operates so far as the external inputs are correct.

On the other hand, suppose that the aforementioned CMOS integrated circuit includes a sequential logical circuit. In general, a sequential logical circuit includes a memory circuit which holds information in some form. When a latch-up phenomenon occurs in this CMOS integrated circuit, a large current flows within the circuit in a portion which is not the original energization path. Thus, the CMOS integrated circuit enters an absolutely disordered state. When the switching means 46 interrupts the current to the CMOS integrated circuit and re-starts supply of the current, the content of the memory circuit included in the CMOS integrated circuit is undefined. Namely, there is a strong possibility that the information forming the basis for the operation of the sequential logical circuit is destroyed.

Therefore, the conventional latch-up cancelling technique must not be applied at least to a CMOS integrated circuit including a sequential logical circuit. The types of logical circuits included in a CMOS integrated circuit are increased as the circuit scale is increased. It may be considered that the possibility for application of the conventional latch-up cancelling technique is reduced.

Another problem is that a complementary circuit device integrated with the latch-up cancelling technique has low reliability in operation upon occurrence of a latch-up phenomenon. Consider that the conventional latch-up cancelling technique is applied to the aforementioned CMOS integrated circuit including the sequential logical circuit. In this case, at least it is possible to automatically cancel a latch-up phenomenon and restore the circuit to the operating state. The problem is that accuracy of operation after the restoration is not guaranteed. The cancellation of the latch-up phenomenon and the restoration to the operating state are automatically performed. Therefore, a user of an apparatus assembled with such a CMOS integrated circuit cannot immediately detect abnormality of the operation.

Description is now made on such case that the conventional latch-up cancelling technique is applied to circuit structure which determines operation procedure by a program counter, such as a microcomputer employing a CMOS integrated circuit, for example. Referring to FIG. 7, symbols A to K denote prescribed addresses in a program storage region. Hatched portions A–B, C–D and E–F are regions storing a group of instructions employed for executing certain operation. An instruction is fetched from a prescribed address of the program storage region in accordance with the content of a program counter, to execute the operation. For example, the program is generally executed in order of A–B, C–D and E–F, as shown in FIG. 7(a).

It is assumed that a latch-up phenomenon occurs in the microcomputer during execution of an instruction from the address I. When the microcomputer is released from the latch-up phenomenon by the conventional latch-up cancelling technique and returns to the operating state, the content of the program counter is undefined.

For example, suppose that the microcomputer returns to the operating state when the program counter indicates the address J. The microcomputer must operate along the order of C–D and E–F. In this case, however, the microcomputer operates in order of C–I and J–F, as shown in FIG. 7(b). The command between I–D and E–J is not executed. When there is an apparatus which is controlled by this microcomputer, the apparatus may cause a significant malfunction. What is worse, operation following the address J is apparently normally continued if the operation is performed along the procedure shown in FIG. 7(b). Thus, the operator may miss the abnormality. Further, a small malfunction may result in a significant failure although the same will cause no bad problem if the same is appropriately coped with upon restoration of the microcomputer to the operating state.

Description is now made on a second example, in which the microcomputer returns to the operating state when the program counter indicates the address K. As shown in FIG. 7(c), the microcomputer re-starts operation from an address which is not the original program region. Thus, operation absolutely foreign to the operation of the microcomputer itself may be performed. Further, the operation of the microcomputer may form an infinite loop. A significant result may be caused also in this case.

Still another problem is that, in the conventional complementary circuit device, the latch-up phenomenon is easily repeated with only a relatively short time interval after cancellation thereof. Once a latch-up phenomenon occurs, therefore, the conventional complementary circuit device cannot perform stable operation.

SUMMARY OF THE INVENTION

Accordingly, an object of the present invention is to provide a complementary circuit device which can automatically cancel a latch-up phenomenon and return to normal operation in high reliability.

Another object of the present invention is to provide a complementary circuit device which is applicable to every CMOS integrated circuit, and which can automatically cancel a latch-up phenomenon and return to normal operation in high reliability.

Still another object of the present invention is to provide a complementary circuit device which can automatically cancel a latch-up phenomenon to thereafter operate with no further repetition of the latch-up phenomenon.

A further object of the present invention is to provide a complementary circuit device which can automatically cancel a latch-up phenomenon to return to normal operation in high reliability, with no hindrance in refinement.

The aforementioned objects can be attained by the inventive complementary circuit device, which includes a complementary circuit, a latch-up detection circuit and a reset circuit. The complementary circuit, which is normally started from a prescribed state in response to initial power supply, may be erroneously started upon power resupply after occurrence of a latch-up phenomenon. The latch-up detection circuit is connected to the complementary circuit, to detect the latch-up phenomenon caused in the complementary circuit. The reset circuit is adapted to reset the complementary circuit from the prescribed state in response to an output signal from the latch-up detection circuit.

In the complementary circuit device having the aforementioned combination, the latch-up detection circuit detects a latch-up phenomenon caused in the complementary circuit and outputs a latch-up detection signal. The reset circuit resets the complementary circuit from the prescribed state in response to the latch-up detection circuit. Thus, the complementary circuit is normally started from the prescribed state similarly to the state upon initial power supply, although the same is just released from the latch-up phenomenon. The latch-up phenomenon is automatically cancelled by the latch-up detection circuit and the reset circuit.

Thus, the present invention can provide a complementary circuit device which can automatically cancel a latch-up phenomenon and return to normal operation in high reliability. Further, there is no need to provide means for preventing the latch-up phenomenon in the complementary circuit, and hence its area is not increased.

According to a preferred embodiment of the present invention, the latch-up detection circuit detects a latch-up phenomenon and outputs a first signal. The latch-up detection circuit further detects cancellation of the latch-up phenomenon, and outputs a second signal, which is different from the first signal, in place of the first signal. The reset circuit includes a switching circuit. This switching circuit is adapted to reduce a current supplied to the complementary circuit to such a degree that at least the latch-up phenomenon is not maintained in response to the first signal, as well as to increase the current supplied to the complementary circuit to an amount sufficient for normal operation in response to the second signal. The reset circuit further includes a memory which is connected to the latch-up detection circuit and the complementary circuit. The memory is adapted to output a third signal in response to the first signal as well as to store information as to occurrence of a latch-up phenomenon by maintaining the output of the third signal at least until the current supplied to the complementary circuit reaches a sufficient amount. Thus, the complementary circuit can detect the third signal when the same is resupplied with power.

The complementary circuit can initialize its interior in response to the third signal. Even if the complementary circuit holds information upset by the latch-up phenomenon, the same can return to the normal operation by the initialization with no possibility of causing a malfunction. Further, the complementary circuit can normally operate after the same is released from the latch-up phenomenon, even if the same includes not only a combinational logical circuit but a sequential logical circuit. Thus, the present invention can provide a complementary circuit device which is applicable to every CMOS integrated circuit, and which can automatically cancel a latch-up phenomenon to return to normal operation in high reliability.

According to a further preferred embodiment of the present invention, the memory circuit stores information as to occurrence of a latch-up phenomenon in response to the first signal, outputs the third signal for a predetermined period of time, and thereafter outputs a fourth signal, which is different from the third signal, in place of the third signal. The switching circuit reduces power supplied to the complementary circuit to be smaller than a predetermined amount in response to the third signal, and increases the power supplied to the complementary circuit to an amount sufficient for the normal operation in response to the fourth signal.

The reset circuit further includes a time measuring circuit. The time measuring circuit starts measurement of time in response to the third signal, and outputs a fifth signal upon detection of a lapse of a predetermined time. The memory circuit outputs the fourth signal in response to the fifth signal.

Since the complementary circuit device includes the aforementioned combination, time measurement is started simultaneously when the power supplied to the complementary circuit is reduced due to occurrence of a latch-up phenomenon. The memory circuit outputs the fourth signal in response to the fifth signal which is outputted from the time measuring circuit after a lapse of the predetermined time. The switching circuit restarts power supply to the complementary circuit in response to the fourth signal.

Heat generated in the complementary circuit by occurrence of the latch-up phenomenon is dispersed during a predetermined time which is measured by the time measuring circuit. The temperature of the complementary circuit returns to a sufficiently low level, so that no latch-up phenomenon is easily repeated after re-starting of its operation.

Thus, the present invention can provide a complementary circuit device, which can automatically cancel a latch-up phenomenon, to thereafter operate with no further repetition of the latch-up phenomenon.

These and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a circuit diagram showing exemplary memory means;

FIG. 10 is a table showing signal changes caused by operation of the memory means;

FIG. 11 is a circuit diagram showing another example of memory means;

DESCRIPTION OF THE PREFERRED EMBODIMENTS

Figure 8:
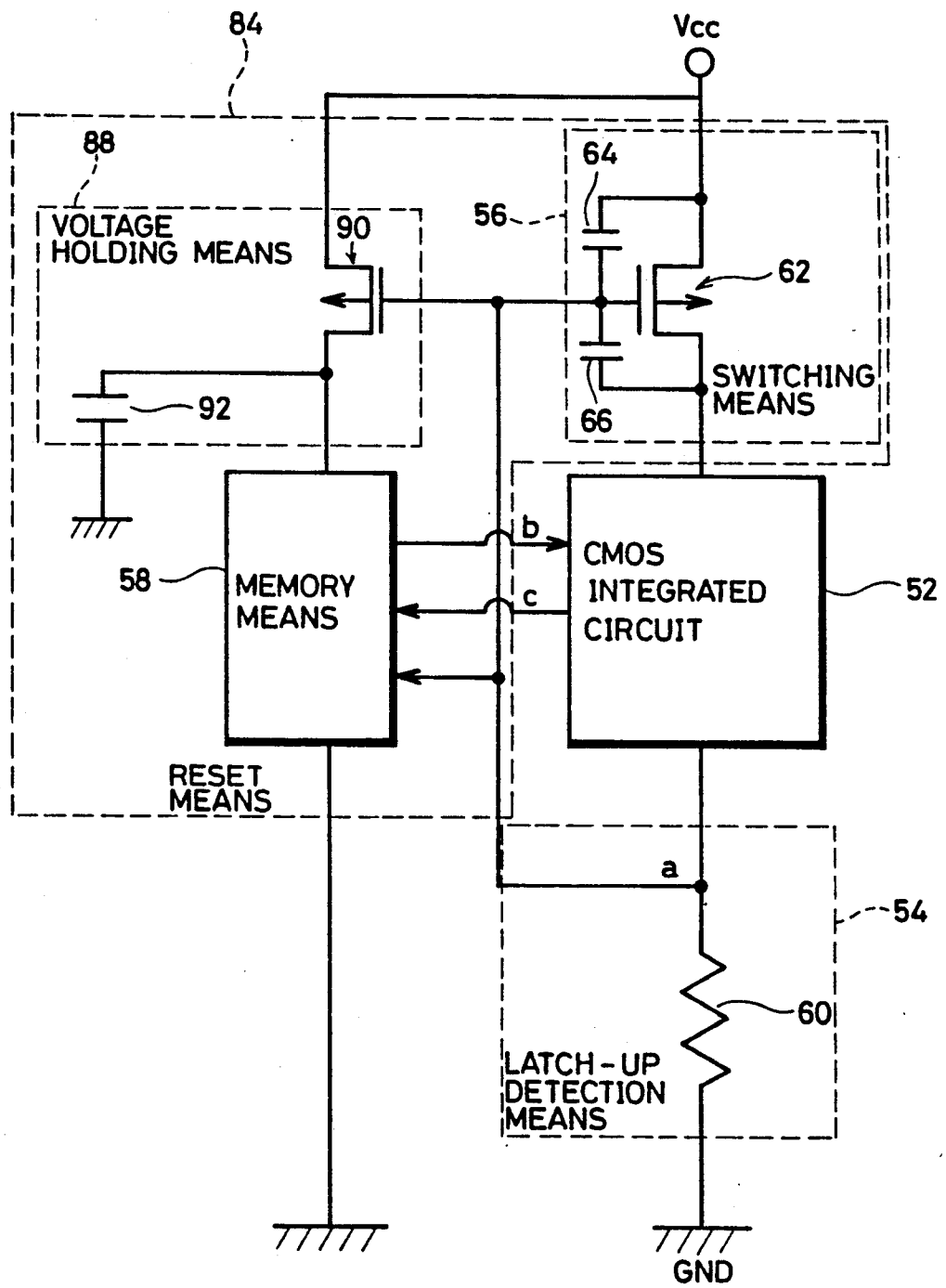
FIG. 8 is a circuit block diagram showing an embodiment of the present invention.

Referring to FIG. 8, a complementary circuit device according to an embodiment of the present invention includes a CMOS integrated circuit 52 which is connected between a power source $V_{CC}$ and the ground GND, latch-up detection means 54 which is connected between the CMOS integrated circuit 52 and the ground GND to detect a current passing through the CMOS integrated circuit 52 thereby to detect occurrence of a latch-up phenomenon, switching means 56 which is connected between the power source $V_{CC}$ and the CMOS integrated circuit 52 to operate in response to the output from the latch-up detection means 54, memory means 58 which is connected between the power source $V_{CC}$ and the ground GND to be connected to the CMOS integrated circuit 52 and the output of the latch-up detection means 54 for storing information indicating that the latch-up detection means 54 has detected current abnormality, and voltage holding means 88 which is connected between the power source $V_{CC}$ and the memory means 58 for supplying proper source voltage to the memory means 58 even if the latch-up phenomenon occurs in the CMOS integrated circuit 52 to cause a large current. The switching means 56, the memory means 58 and the voltage holding means 88 define reset means 84.

The latch-up detection means 54 includes a resistor 60 which is connected between the CMOS integrated circuit 52 and the ground GND for changing the potential of a node between the same and the CMOS integrated circuit 52 by the current passing through the CMOS integrated circuit 52 and outputting a latch-up detection signal a.

The switching means 56 includes a P-channel transistor 62 which has a gate connected to the output of the latch-up detection means 54, a source connected to the power source $V_{CC}$ and a drain connected to the CMOS integrated circuit 52 respectively, a capacitor 64 which is connected between the gate of the P-channel transistor 62 and the power source $V_{CC}$, and another capacitor 66 which is connected between the gate of the P-channel transistor 62 and the CMOS integrated circuit 52.

The memory means 58 is formed by a circuit shown in FIG. 9, for example. Referring to FIG. 9, the memory means 58 includes first and second NAND circuits 68 and 70 which are connected with each other to form a flip-flop 76, a first inverter 72 which has an input connected to the output of the latch-up detection means 54 and an output connected to the input of the first NAND circuit 68, and a second inverter 74 which has an input connected to the CMOS integrated circuit 52 and an output connected to the input of the second NAND circuit 70. The output of the first NAND circuit 68 is connected to a node between the same and the CMOS integrated circuit 52.

The voltage holding means 88 includes a P-channel transistor 90 which is connected between the power source $V_{CC}$ and the memory means 58, and a capacitive element 92 which is inserted between the drain of the transistor 90 and the ground potential GND. The P-channel transistor 90 has a source which is connected to the power source $V_{CC}$, a gate which is connected to the output of the latch-up detection means 54, and a drain which is connected to the memory means 58 and the capacitive element 92.

With reference to FIGS. 8 and 9, operation of this complementary circuit device is now described. When the CMOS integrated circuit 52 is in a normal operating state, the current passing through the same is relatively small. Potential difference developed across the resistor 60 is small, and the output from the latch-up detection means 54 has a low potential. The gate voltage of the P-channel transistor 62, which is controlled by the latch-up detection signal a, is low. The P-channel transistor 62 is in a sufficient conducting state. The CMOS integrated circuit 52 is supplied with sufficient voltage, and is capable of maintaining the normal operating state. FIG. 10(a) shows the internal state of the memory means 58 at this time. The potential of the latch-up detection signal a is at a low level. The CMOS integrated circuit 52 generally sends a low-level signal c to the memory means 58. An output b of the memory means 58 is at a low level. The P-channel transistor 90 is in an on state since the latch-up detection signal a is at the low level. The memory means 58 is supplied with sufficient source voltage. The capacitive element 92 stores a sufficient amount of charges.

The following description is made on such case that the power source $V_{CC}$ for the CMOS integrated circuit 52 receives positive noise, which may cause a latch-up phenomenon. The first and second capacitors 64 and 77 have functions of attenuating such noise. There is little possibility that relatively small noise causes a latch-up phenomenon in the CMOS integrated circuit 52. When strong noise is received, however, a latch-up phenomenon may occur in the CMOS integrated circuit 52.

The operation of the complementary circuit device upon occurrence of a latch-up phenomenon is now described. In this case, the current flowing between the power source $V_{CC}$ for the CMOS integrated circuit 52 and the ground GND is considerably larger than that in normal operation. The potential of the output signal a from the latch-up detection means 54 is increased by potential difference caused by the resistor 60. The gate electrode of the P-channel transistor 62 is connected to the output a of the latch-up detection means 54. Therefore, the resistance value of the P-channel transistor 62 is increased, and the current supplied to the CMOS integrated circuit 52 is reduced. Consequently, an effect similar to isolation between the CMOS integrated circuit 52 and the power source $V_{CC}$ is caused to cancel the latch-up phenomenon. Further, the potential difference developed across the resistor 60 is reduced due to reduction of the current flowing therein, and hence the potential of the signal a is reduced.

Upon occurrence of the latch-up phenomenon, the current flowing from the power source $V_{CC}$ to the ground GND through the CMOS integrated circuit 52 is abruptly increased, and a voltage drop may be developed in the power source $V_{CC}$. This voltage drop may exert unfavorable influence on the operation of the memory means 58, which is also supplied with power from the power source $V_{CC}$.

The voltage holding means 88 is adapted to prevent the operation of the memory means 58 from the aforementioned unfavorable influence. This action is now described. Upon occurrence of the latch-up phenomenon, the potential of the output signal a of the latch-up detection means 54 is increased. The transistor 90, whose gate is controlled by the signal a, is turned off. The memory means 58 is supplied with the charges stored in the capacitive element 92, while the transistor 90 is in the off state. The voltage drop developed in the power source $V_{CC}$ is not transferred to the memory means 58 by the transistor 90. Thus, the memory means 58 can normally operate also upon occurrence of the latch-up phenomenon. When the latch-up phenomenon is cancelled, the potential of the signal a is reduced. The transistor 90 is turned on, and thereafter the memory means 58 is supplied with power from the power source $V_{CC}$.

The states of the memory means 58 up to cancellation of the latch-up phenomenon is now described with reference to FIG. 10(a) to (c). As hereinabove described, the potentials of the signals a, b and c are at low levels, as shown in FIG. 10(a). Upon occurrence of the latch-up phenomenon, the potentials of the signals a, b and c enter the states shown in FIG. 10(b). First, the potential of the signal a is raised up to a high level. The output of the flip-flop 76 attains a high level.

When the CMOS integrated circuit 52 is released from the latch-up phenomenon by the switching means 56, the potentials of the signals a, b and c attain the states shown in FIG. 10(c). The potential of the signal a returns to the low level. The potential of the output b of the flip-flop 76 remains at the high level, due to such property of the flip-flop 76 that its output remains in a previous state when both of two inputs attain high levels (the levels of the signals a and c are inverted by the inverters 72 and 74 respectively). Namely, the memory means 58 stores information as t the occurrence of the latch-up phenomenon in the CMOS integrated circuit 52 as the high-level signal appearing at the output b. The memory means 58 continuously holds the high-level signal appearing at the output b after the latch-up phenomenon is cancelled.

Description is now made on the operation of the complementary circuit device performed after cancellation of the latch-up phenomenon. The gate voltage of the P-channel transistor 62 is reduced following reduction in potential of the signal a. The P-channel transistor 62 returns to the sufficient conducting state. The CMOS integrated circuit 52 returns to the normal operating state since the same is resupplied with sufficient voltage.

However, since power supply to the CMOS integrated circuit 52 has been interrupted once, contents of memories, registers etc. provided in the CMOS integrate circuit 52 are undefined. There is a strong probability that a malfunction is caused when the CMOS integrated circuit 52 operates again in this state.

In the complementary circuit device according to the present invention, however, the memory means 58 holds the information as to the occurrence of the latch-up phenomenon. In other words, the memory means 58 supplies the high-level signal b to the CMOS integrated circuit 52. The CMOS integrated circuit 52 may be so structured as to perform operation for initializing itself when the high-level signal b is received.

Figure 1:
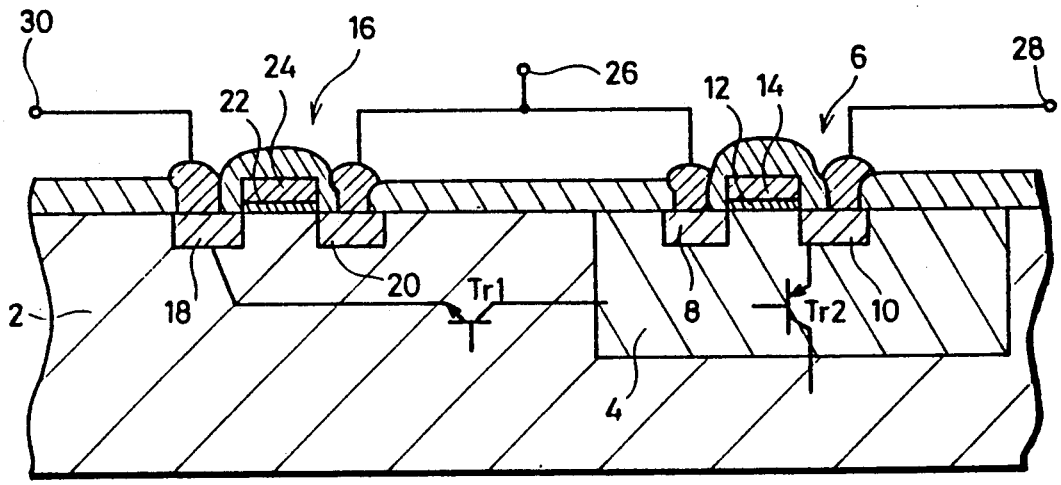
FIG. 1 is a sectional view showing an example of a conventional CMOS integrated circuit.
Figure 2:
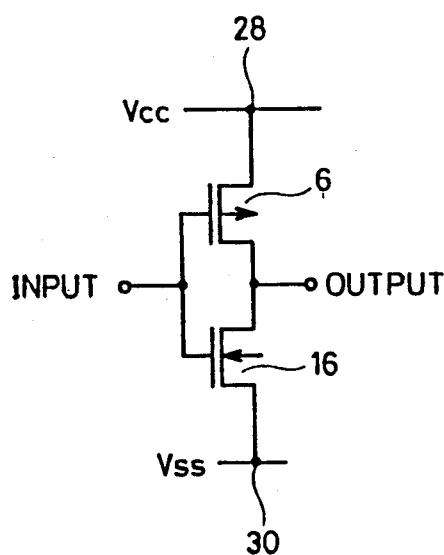
FIG. 2 is a circuit diagram showing an inverter which is equivalent to the circuit shown in FIG. 1.
Figure 3:
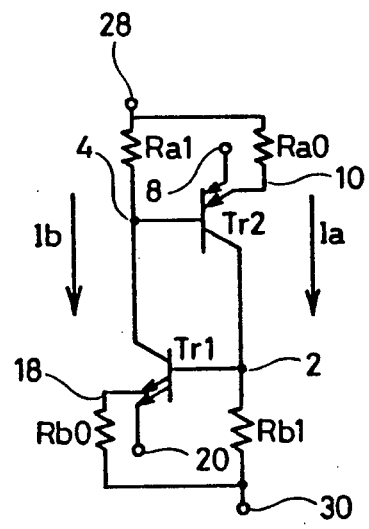
FIG. 3 is a circuit diagram showing a circuit formed by parasitic bipolar transistors of FIG. 1.
Figure 4:
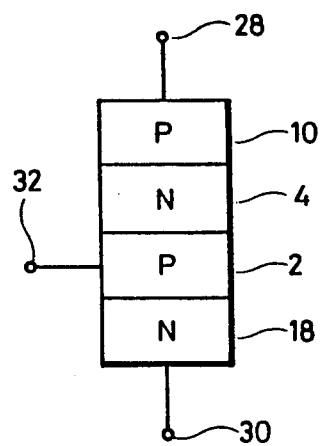
FIG. 4 is a typical circuit diagram of a thyristor.
Figure 5:
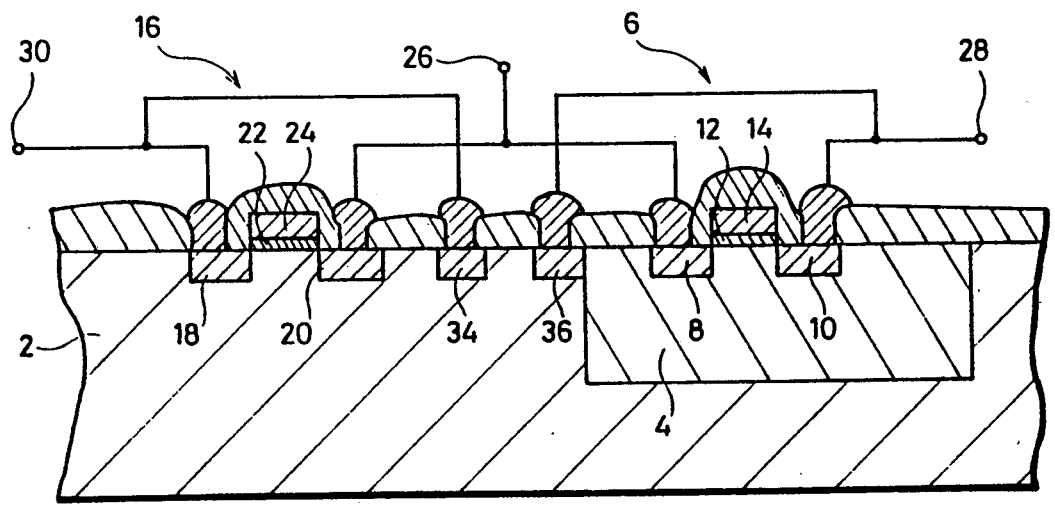
FIG. 5 is a sectional view showing an example of a CMOS integrated circuit having a conventional latch-up preventing technique.
Figure 6:
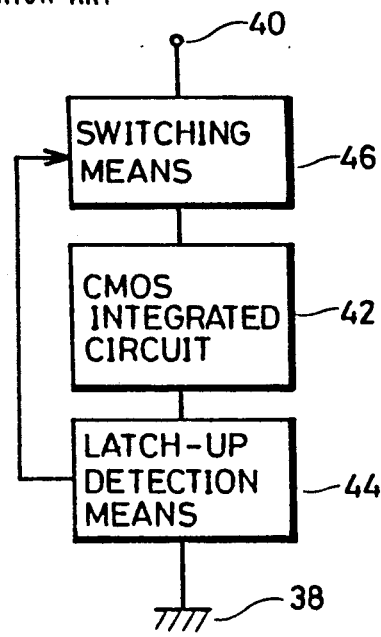
FIG. 6 is a block diagram typically showing a conventional latch-up cancelling technique.
Figure 7:
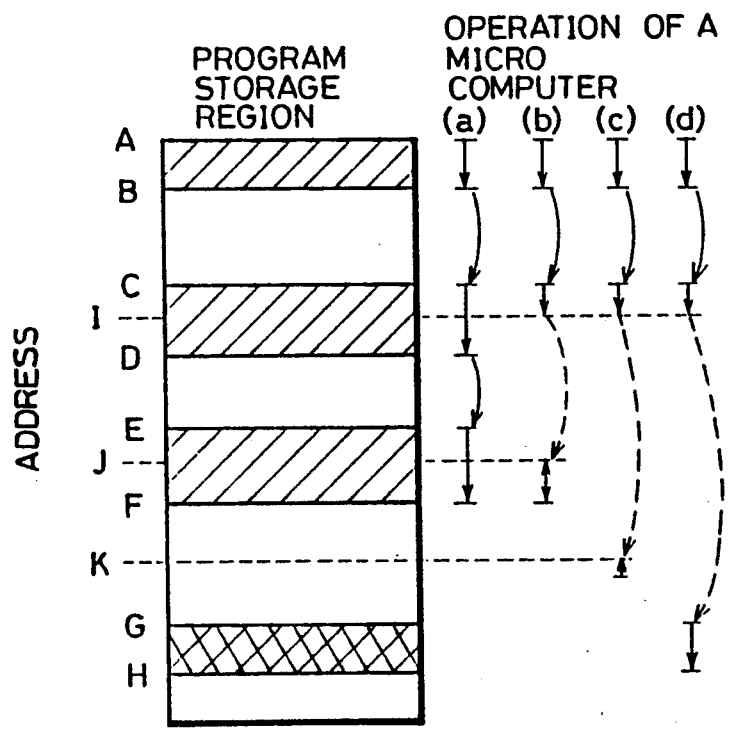
FIG. 7 typically illustrates operation of a microcomputer.

Referring again to FIG. 7, description is now made on such case that the CMOS integrated circuit 52 is formed by a microcomputer etc., which operates through a program counter similarly to the example described in relation to the prior art. Suppose that a latch-up phenomenon occurs at a time when the program counter indicates an address I of a program storage region, similarly to the above description in relation to the prior art. In the case of the prior art, required operation is omitted as shown in FIG. 7(b), or unnecessary operation is executed as shown in FIG. 7(c). In the complementary circuit device according to the present invention, on the other hand, the microcomputer is necessarily supplied with a high-level signal b indicating restoration from the latch-up phenomenon. Therefore, the microcomputer may be so structured as to necessarily perform prescribed operation in this case.

As shown in FIG. 7, for example, an instruction group for initialization is previously stored in the addresses G to H of the program storage region. Upon release from the latch-up phenomenon, the microcomputer necessarily executes the instruction group stored in the addresses G to H regardless of the content of the program counter, so far as the signal b is at a high level. Thus, it is possible to correctly re-execute prescribed operation form the head. It is also possible to urge an operator to intervene, if necessary.

It is further possible to clear the content of the memory means 58 upon completion of initialization. Thus, the inventive complementary circuit device can be automatically released from every possible latch-up phenomenon that may be repeated therein.

Description is now made on operation for clearing the content of the flip-flop 76 shown in FIG. 9, for example. Referring to FIG. 10, the signal b shown at (c) indicates the information as to occurrence of the latch-up phenomenon. The CMOS integrated circuit 52 inputs the high-level signal c in the flip-flop 76 upon completion of the initialization. As shown in FIG. 10(d), the signal b appearing at the output of the flip-flop 76 attains low level.

The CMOS integrated circuit 52 confirms that the potential of the output b of the memory means 58 attains low level, and restore the signal c sent to the flip-flop 76 from the high level to low level. As shown in FIG. 10(e), the signal b is maintained at the last state, i.e., the low-level state due to the property of the flip-flop 76.

It is clear that the states of the respective signals a, b and c shown in FIG. 10(e) are identical to those shown in FIG. 10(a). That is, since the flip-flop 76 returns to the state shown in FIG. 10(e), the complementary circuit device completely returns to the normal operation performed before the occurrence of the latch-up phenomenon. It has been clarified that the complementary circuit device of this embodiment can be automatically released from every possible latch-up phenomenon that may be repeated, to return to the normal operating state. Further, there is little possibility for a malfunction since necessary initialization is performed.

FIG. 11 is a circuit diagram showing memory means 58' according to another embodiment of the present invention. Referring to FIG. 11, the memory means 58' includes a transmission gate 78 which receives a signal a, an inverter 80 which is connected to the output of the transmission gate 78, and a NOR circuit 82 which has an input for receiving a signal c and another input connected to the output of the inverter 80.

An N-channel gate of the transmission gate 78 directly receives the signal. A P-channel gate of the transmission gate 78 receives an inverted signal $\bar{a}$ of the signal a. The output of the transmission gate 78 is connected with that of the NOR circuit 82.

The operation of this circuit is now described with reference to FIGS. 8 and 11. When the CMOS integrated circuit 52 is in a normal operating state, the potential of the signal a is at a low level. The potential of the signal c from the CMOS integrated circuit 52 to the memory means 58' is also at a low level. The transmission gate 78 is in an off state. The potential of the output from the inverter 80 is at a high level. One input of the NOR circuit 82 is at a high level, and the other is at a low level. Therefore, the potential of an output b of this circuit is at a low level. This state is shown in FIG. 10(a).

Suppose that a latch-up phenomenon occurs and the potential of the signal a attains high level. The transmission gate 78 is turned on. The output of this circuit 48' goes high regardless of the value of the signal c. The signal c is in a low-level state, as shown in FIG. 10(b).

Then, the P-channel transistor 62 enters an off state due to increase in the potential of the signal a. The CMOS integrated circuit 52 is released from the latch-up phenomenon, and the current flowing between the power source $V_{CC}$ and the ground GND is reduced. Thus, the potential of the signal a is reduced and the transmission gate 78 enters an off state.

The input of the inverter 80 reaches the same potential as the output of the NOR circuit 82. Since the output of the NOR circuit 82 is at the high level, a high-level signal is inputted in the inverter 80. Both inputs of the NOR circuit 82 go low, and the output b is maintained at a high level, as shown in FIG. 10(c).

The potential of the signal a is further reduced and the P-channel transistor 62 enters a sufficient conducting state. The CMOS integrated circuit 52 returns to the operating state. The memory means 58' inputs the high-level signal b in the CMOS integrated circuit 52. In response to the signal b from the memory means 58', the CMOS integrated circuit 52 performs necessary initialization.

Upon completion of the initialization, the CMOS integrated circuit 52 transmits a high-level signal c to the memory means 58'. The transmission gate 78 is in an off state. The inverter 80 receives a high-level signal. The NOR circuit 82 receives the high-level signal c from the CMOS integrated circuit 52, and a low level signal from the inverter 80. The output of the NOR circuit 82 goes low, as shown in FIG. 10(d).

The CMOS integrated circuit 52 confirms that the signal b returns to the low level, and then switches the signal c to be transmitted to the memory means 58' to a low level. The transmission gate 78 is in an off state and the input to the inverter 80 is at a low level. The signal c inputted in the NOR circuit 82 is at a low level, and a signal inputted from the inverter 80 is at a high level. Therefore, the output of the NOR circuit 82 goes low, as shown in FIG. 10(e).

Thus, it is also possible to perform operation similar to that of the circuit 58 shown in FIG. 9 through the circuit 58' shown in FIG. 11.

Figure 12:
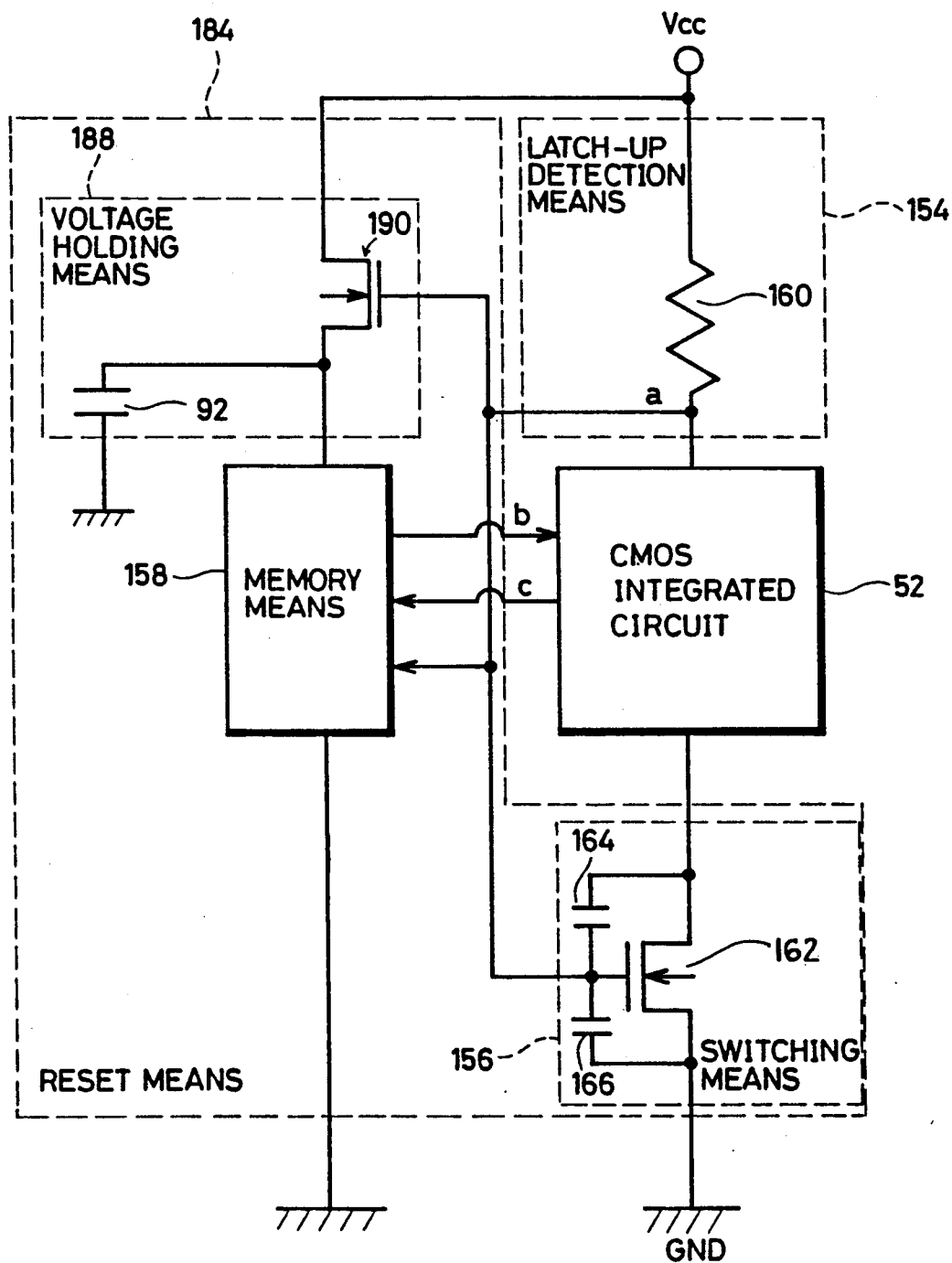
FIG. 12 is a circuit block diagram showing another embodiment of the present invention.

Referring to FIG. 12, a complementary circuit device according to still another embodiment of the present invention includes a CMOS integrated circuit 52 which is connected between a power source $V_{CC}$ and the ground GND, latch-up detection means 154 which is connected between the CMOS integrated circuit 52 and the power source $V_{CC}$ to detect a current passing through the CMOS integrated circuit 52 thereby to detect occurrence of a latch-up phenomenon, switching means 156 which is connected between the ground GND and the CMOS integrated circuit 52 to operate in response to the output from the latch-up detection means 154, memory means 158 which is connected between the power source $V_{CC}$ and the ground GND to be connected to the CMOS integrated circuit 52 and the output of the latch-up detection means 154 for storing information indicating that the latch-up detection means 154 detects current abnormality, and voltage holding means 188 which is connected between the power source $V_{CC}$ and the memory means 158 for supplying proper source voltage to the memory means 158 even if a latch-up phenomenon occurs in the CMOS integrated circuit 52 to cause a large current. The switching means 156, the memory means 158 and the voltage holding means 188 define reset means 184.

The latch-up detection means 154 includes a resistor 160 which is connected between the CMOS integrated circuit 52 and the power source $V_{CC}$ for changing the potential of a node between the same and the CMOS integrated circuit 52 by the current passing through the CMOS integrated circuit 52 and outputting a latch-up detection signal a.

The switching means 156 includes an N-channel transistor 162 which has a gate connected to the output of the latch-up detection means 154, a source connected to the power source $V_{CC}$ and a drain connected to the CMOS integrated circuit 52 respectively, a capacitor 164 which is connected between the gate of the N-channel transistor 162 and the CMOS integrated circuit 52, and another capacitor 166 which is connected between the gate of the N-channel transistor 162 and the ground GND.

Figures 13, 14:
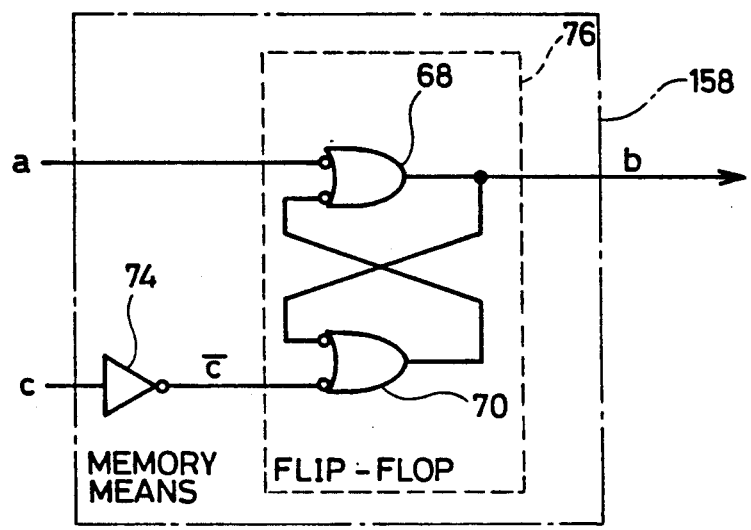
FIG. 13 is a block diagram showing an example of memory means 158 shown in FIG. 12.
FIG. 14 is a table showing signal changes caused by operation of the memory means 158.

The memory means 158 is formed by a circuit shown in FIG. 13, for example. Referring to FIG. 13, the memory means 158 is identical to the memory means 58 shown in FIG. 9, except that the same has no first inverter 72.

The voltage holding means 188 includes an N-channel transistor 190 which is connected between the power source $V_{CC}$ and the memory means 158, and a capacitive element 92 which is inserted between the drain of the transistor 190 and the ground potential GND. The transistor 190 has a source which is connected to the power source $V_{CC}$, a gate which is connected to the output of the latch-up detection means 154, and a drain which is connected to the memory means 158 and the capacitive element 92.

With reference to FIGS. 12 and 13, operation of this complementary circuit device is now described. When the CMOS integrated circuit 52 is in a normal operating state, the current passing through the same is relatively small. Potential difference developed across the resistor 160 is small, and the output a from the latch-up detection means 154 has a high potential. The gate voltage of the N-channel transistor 162, which is controlled by the latch-up detection signal a, is high. The N-channel transistor 162 is in a sufficient conducting state. The CMOS integrated circuit 52 is supplied with sufficient voltage, and is capable of maintaining the normal operating state. FIG. 14(a) shows the internal state of the memory means 158 at this time. The potential of the latch-up detection signal a is at a high level. The CMOS integrated circuit 52 generally sends a low-level signal c to the memory means 158. The output b of the memory means 158 is at a low level. The N-channel transistor 190 is in an on state since the latch-up detection signal a is at a high level. The memory means 150 is supplied with sufficient source voltage. The capacitive element 92 stores a sufficient amount of charges.

The following description is made on such case that the power source $V_{CC}$ for the CMOS integrated circuit 52 receives positive noise, which may cause a latch-up phenomenon. The first and second capacitors 164 and 166 have functions of attenuating such noise. There is little possibility that relatively small noise causes a latch-up phenomenon in the CMOS integrated circuit 52. When strong noise is received, however, a latch-up phenomenon may occur in the CMOS integrated circuit 52.

The operation of the complementary circuit device upon occurrence of a latch-up phenomenon is now described. In this case, the current flowing between the power source $V_{CC}$ for the CMOS integrated circuit 52 and the ground GND is considerably larger than that in normal operation. The potential of the output signal a from the latch-up detection means 154 is reduced by potential difference caused by the resistor 160. The gate electrode of the N-channel transistor 162 is connected to the output a of the latch-up detection means 154. Therefore, the resistance value of the N-channel transistor 162 is increased, and the current supplied to the CMOS integrated circuit 52 is reduced. Consequently, an effect similar to isolation between the CMOS integrated circuit 52 and the power source $V_{CC}$ is caused to cancel the latch-up phenomenon. Further, the potential difference developed across the resistor 160 is reduced due to reduction of the current flowing therein, and hence the potential of the signal a is increased.

The voltage holding means 188 is adapted to prevent the operation of the memory means 158 from unfavorable influence exerted by a voltage drop developed in the power source $V_{CC}$ upon occurrence of the latch-up phenomenon. This action is now described. Upon occurrence of the latch-up phenomenon, the potential of the output signal a of the latch-up detection means 154 is reduced. The transistor 190, whose gate is controlled by the signal a, is turned off. The memory means 158 is supplied with the charges stored in the capacitive element 92, during the time when the transistor 190 is in the off state. The voltage drop developed in the power source $V_{CC}$ is not transferred to the memory means 158 by the transistor 190. Thus, the memory means 158 can normally operate also upon occurrence of the latch-up phenomenon. When the latch-up phenomenon is cancelled, the potential of the signal a is increased. The transistor 190 is turned on, and thereafter the memory means 158 is supplied with power from the power source $V_{CC}$.

FIG. 14(a) to (c) shows the states of the memory means 158 up to cancellation of the latch-up phenomenon. FIG. 14 is different from FIG. 10 in that all values of the signal a are inverted. In the case of the first embodiment, the signal a is inverted by the inverter 72 to be supplied to the flip-flop 76. Referring to FIG. 14, no inverter 72 is provided but the signal a is directly supplied to the flip-flop 76, thereby to attain operation identical to that of the flip-flop 76 in the first embodiment.

Description is now made on the operation of the complementary circuit device performed after cancellation of the latch-up phenomenon. The gate voltage of the N-channel transistor 162 is reduced following increase in potential of the signal a. The N-channel transistor 162 returns to the sufficient conducting state. The CMOS integrated circuit 52 returns to the normal operating state since the same is resupplied with sufficient voltage.

As clearly understood from the above description, an effect similar to that of the first embodiment can be also attained in the third embodiment shown in FIGS. 12 and 13.

Figure 15:
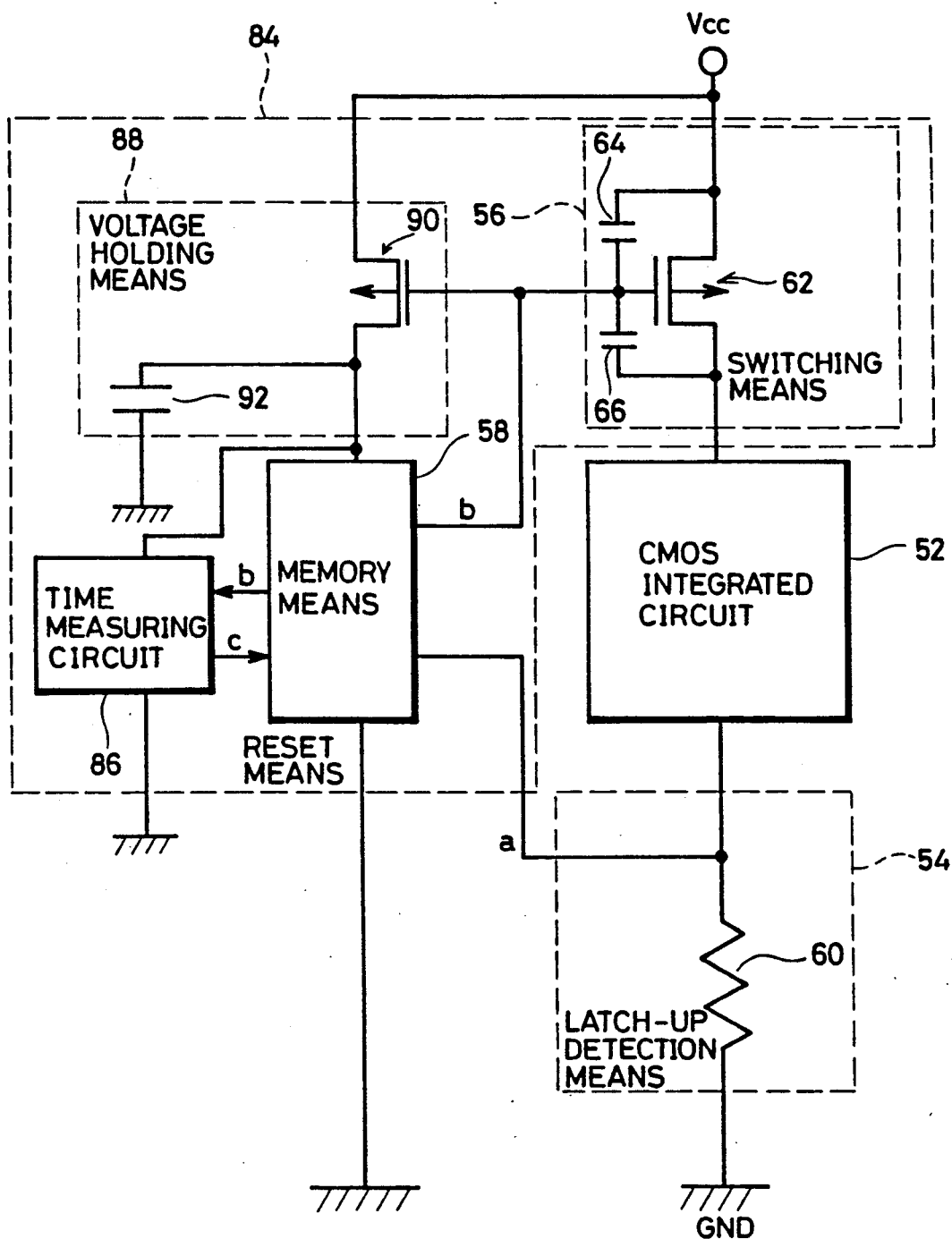
FIG. 15 is a circuit block diagram showing still another embodiment of the present invention.

With reference to FIG. 15, a complementary circuit device according to a fourth embodiment of the present invention is now described. This circuit device is different from that shown in FIG. 8 in the following three points:

i) Reset means 84 further includes a time measuring circuit 86 connected to the memory means 58 and supplied with power by the voltage holding means 88, for measuring the time elapsing after switching means 56 is turned off, in order to control the timing of the turning-on of the switching means 56 by the memory means 58.

ii) Gate electrodes of transistors 62 and 90 are connected to the memory means 58 in place of latch-up detection means 54.

iii) A signal c for clearing the memory means 58 is outputted from the time measuring circuit 86 in place of a CMOS integrated circuit 52.

An output b of the memory means 58 is inputted in the time measuring circuit 86, to trigger starting of time measurement.

Referring to FIGS. 15 and 8, identical components are indicated by the same numerals and designations. Functions thereof are also identical to each other. Therefore, operation and structure thereof are not repeated here in detail. Operation and effects specific to this embodiment are now described.

An output signal a from the latch-up detection means 54 goes high upon occurrence of a latch-up phenomenon. The memory means 58 detects this change, and switches its output signal b to a high level. The switching means 56 interrupts a current to the CMOS integrated circuit 52 in response to the signal b, absolutely identically to the operation in the first embodiment. Further, the voltage holding means 88 stabilizes power supply to the memory means 58 and the time measuring circuit 86 also similarly to the first embodiment.

The signal b is also supplied to the time measuring circuit 86. The time measuring circuit 86 detects the change of the signal b to the high level, and starts time measurement. After a lapse of a predetermined time, the time measuring circuit 86 switches its output signal c from a low level to a high level. Since the memory means 58 is formed by elements which are absolutely similar to those in the first embodiment, the output signal c thereof is changed from the high level to a low level as described above with reference to FIG. 10(d).

The transistor 62 is turned on in response to the above change. The CMOS integrated circuit 52 is resupplied with a sufficient current, to start normal operation. The time measuring circuit 86 switches its output c to a low level in response to the change of the signal b to the low level. Consequently, the signals a, b and c enter the states shown in FIG. 10(a) and (e), whereby the overall complementary circuit device returns to the normal operation.

The feature of this embodiment resides in that the time measuring circuit 86 provides a predetermined time lapse before the switching means 56 re-enters an on state after the same is turned off. Thus, the following effect is attained:

A latch-up phenomenon is caused by noise above a certain degree of level inputted in CMOS structure, and no latch-up phenomenon is caused by noise whose level is lower than the said level. In general, such a boundary noise level is reduced as the temperature of the CMOS structure is increased.

In occurrence of a latch-up phenomenon, a large current flows in the CMOS structure, whose temperature is increased by heat generation due to a resistance value. The temperature of the CMOS structure is not immediately reduced even if the latch-up phenomenon is cancelled as in the first embodiment. When the CMOS integrated circuit is restored before the temperature is sufficiently reduced, a new latch-up phenomenon may be caused by smaller noise as compared with that causing the last latch-up phenomenon. There is some possibility that latch-up phenomenons are repeated if the complementary circuit must operate under conditions with frequent noise.

This embodiment has an effect of eliminating the aforementioned possibility and further reducing repetition of latch-up phenomenons. Namely, the switching means 56 is retained in the off state by a time required for sufficiently reducing the temperature of the CMOS integrated circuit 52, thereby to improve reliability of the operation of the CMOS integrated circuit 52 performed after re-starting of normal operation.

This embodiment has been described with reference to the structure which is similar to that of the complementary circuit device according to the first embodiment. However, a similar effect can also be attained through structure which is similar to that of the third embodiment. Although the memory means 58 does not directly exchange signals with the CMOS integrated circuit 52, signals may be exchanged similarly to the first embodiment, to initialize the CMOS integrated circuit 52 upon cancellation of a latch-up phenomenon.

Figure 16:
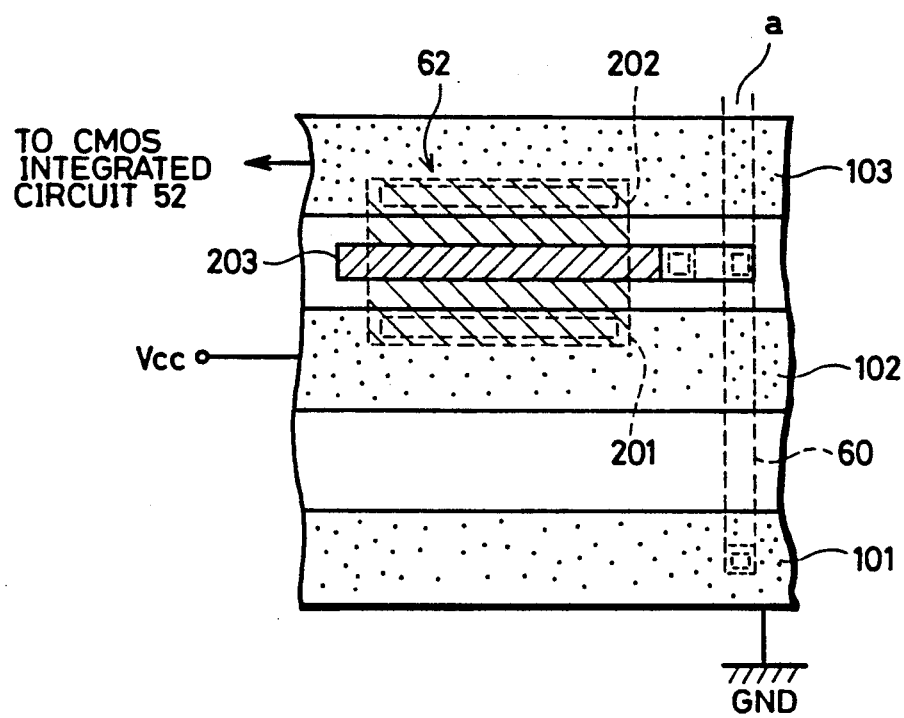
FIG. 16 is an enlarged plan view showing a part of a CMOS integrated circuit substrate for illustrating installation of a transistor serving as an example of switching means according to the present invention.

FIG. 16 is a partially enlarged plan view showing an example of an actual integrated circuit device of the transistor 62 in the first embodiment. Referring to FIG. 16, the transistor 62 has a source 201, a drain 202 and a gate 203. The integrated circuit device has, in its periphery, an earth electrode 101, a power electrode 102, and an electrode 103 to which the CMOS integrated circuit 52 (see FIG. 8) is connected. A resistor layer 60 is connected to the earth electrode 101.

The transistor 62 is provided between the electrodes 102 and 103. The gate 203 is connected to the resistor layer 60 and the source 201 is connected to the power electrode 102, while the drain 202 is connected to the electrode 103.

The resistor layer 60 is supplied with the signal a shown in FIG. 8. The transistor 62 is controlled by the signal a to connect/cut off the power electrode 102 to/from the electrode 103. As hereinabove described, the transistor 62 can be provided between existing electrodes, thereby to prevent area increase of the integrated circuit device.

As shown in FIG. 9 or 11, the memory means 58 can be implemented by a simple circuit. Also the time measuring circuit 86 can be implemented by a simple timer. According to the present invention, therefore, a latch-up phenomenon can be cancelled without increasing the area of the complementary circuit device, while the CMOS integrated circuit can operate in a stable manner.

The present invention is not restricted to the aforementioned embodiments. For example, voltage change of a current caused by resistance is employed as the latch-up detection means in each of the above embodiments. However, a similar effect can be attained by employing another type of current detection circuit. Further, the reset means is not restricted to the aforementioned combination of memory means and switching means.

In addition to the aforementioned two types of circuits, various circuits may be applied to the memory means. An effect similar to that in each of the aforementioned embodiments can be attained so far as the memory means is not directly influenced by a latch-up phenomenon occurring in the CMOS integrated circuit but can hold information by some method.

The voltage holding means has been employed in each of the aforementioned embodiments. However, the voltage holding means is merely adapted to ensure the operation of the memory means etc., and is not requisite in the present invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A complementary circuit device including:
   a complementary circuit being normally started from a prescribed logic state in response to initial application of power to said complementary circuit, wherein said complementary circuit is of a type which includes at least one sequential logic circuit;
   latch-up detection means connected to said complementary circuit for detecting a latch-up phenomenon occurring in said complementary circuit; and
   reset means for resetting said complementary circuit to said prescribed logic state in response to an output signal from said latch-up detection means, wherein
   said latch-up detection means detects said latch-up phenomenon to output a first signal of a first logic level, and detects cancellation of said latch-up phenomenon to change the first signal to a second logic level which is different from the first logic level of said first signal.

2. A complementary circuit device in accordance with claim 1, wherein
   said reset means includes switching means for reducing the power supplied to said complementary circuit at least to a degree not maintaining said latch-up phenomenon in response to said first logic level of said first signal and increasing said power supplied to said complementary circuit to an amount sufficient for normal operation in response to said second logic level of said first signal.

3. A complementary circuit device including:
   a complementary circuit being normally started from a prescribed state in response to initial application of power to said complementary circuit, wherein said complementary circuit may be erroneously started by power resupplied immediately after occurrence of a latch-up phenomenon;
   latch-up detection means connected to said complementary circuit for detecting a latch-up phenomenon occurring in said complementary circuit, wherein said latch-up detection means detects said latch-up phenomenon to output a first signal of a first logic level, and detects cancellation of said latch-up phenomenon to change the first signal to a second logic level which is different form the first logic level of said first signal; and
   reset means for resetting said complementary circuit form said prescribed state in response to said first signal from said latch-up detection means, wherein said reset means includes:
   (i) switching means for reducing the power supplied to said complementary circuit at least to a degree not maintaining said latch-up phenomenon in response to said first logic level of said firs signal and increasing said power supplied to said complementary circuit to an amount sufficient for normal operation in response to said second logic level of said first signal,
   (ii) memory means connected to said latch-up detection means and said complementary circuit to output a second signal in response to said first logic level of said first signal as well as to store information as to occurrence of said latch-up phenomenon by maintaining the output of said second signal at least until said power supplied to said complementary circuit reaches a sufficient amount, whereby said complementary circuit detects said second signal when said complementary circuit is resupplied with power.

4. A complementary circuit device in accordance with claim 3, wherein said memory means is connected to a power source which is common to said memory means and said complementary circuit.

5. A complementary circuit device in accordance with claim 4, wherein said reset means further includes voltage holding means for maintaining a voltage supplied from said power source to said memory means at a constant value in response to said first logic level of said first signal.

6. A complementary circuit device including:

a complementary circuit being normally started from a prescribed state in response to initial application of power to said complementary circuit, wherein said complementary circuit may be erroneously started by power resupplied immediately after occurrence of a latch-up phenomenon;

latch-up detection means connected to said complementary circuit for detecting a latch-up phenomenon occurring in said complementary circuit, wherein said latch-up detection means detects said latch-up phenomenon to output a first signal of a first logic level, and detects cancellation of said latch-up phenomenon to change the first signal to a second logic level which is different from the first logic level of said first signal; and reset means for resetting said complementary circuit from said prescribed state in response to said first signal from said latch-up detection means, wherein said reset means includes:

(i) memory means for storing information as to occurrence of said latch-up phenomenon in response to said first logic level of said first signal, outputting a second signal of a first logic level for a predetermined period and thereafter changing said second signal to a second logic level which is different form said first logic level of said second signal, and (ii) switching means for reducing the power supplied to said complementary circuit at least to be smaller than a predetermined amount in response to said first logic level of said second signal, and increasing said power supplied to said complementary circuit to an amount sufficient for normal operation in response to said second logic level of said second signal.

7. A complementary circuit device in accordance with claim 6, wherein said reset means further includes time measuring means starting time measurement in response to said first logic level of said second signal, detecting a lapse of said predetermined period and outputting a third signal.

8. A complementary circuit device in accordance with claim 7, wherein said memory means is connected to a power source which is common to said memory means and said complementary circuit.

9. A complementary circuit device in accordance with claim 8, wherein said reset means further includes voltage holding means for maintaining a voltage supplied from said power source to said memory means at a constant value in response to said first logic level of said second signal.

10. A complementary circuit device in accordance with claim 9, wherein said time measuring means is supplied with power by said voltage holding means.

11. A complementary circuit device in accordance with claim 2, wherein said latch-up detection means includes current-voltage conversion means for converting current flowing in said complementary circuit to voltage.

12. A complementary circuit device including:

a complementary circuit being normally started from a prescribed state in response to initial application of power to said complementary circuit, wherein said complementary circuit may be erroneously started by power resupplied immediately after occurrence of a latch-up phenomenon, wherein said complementary circuit is provided between a first power source and a second power source;

latch-up detection means connected to said complementary circuit for detecting a latch-up phenomenon occurring in said complementary circuit, wherein said latch-up detection means detects said latch-up phenomenon to output a first signal of a first logic level, and detects cancellation of said latch-up phenomenon to change the first signal to a second logic level which is different from the first logic level of said first signal, said latch-up detection means including current-voltage conversion means for converting current flowing in said complementary circuit to voltage; and reset means for resetting said complementary circuit from said prescribed state in response to said first signal from said latch-up detection means, wherein said reset means includes:

switching means for reducing the power supplied to said complementary circuit at least to a degree not maintaining said latch-up phenomenon in response to said first logic level of said first signal and increasing said power supplied to said complementary circuit to an amount sufficient for normal operation in response to said second logic level of said first signal, said switching means including an active element provided between said first power source and said second power source in series with said complementary circuit to be controlled by an output of said current-voltage conversion means.

* * * * *